United States Patent
Sanada et al.

(10) Patent No.: US 12,240,061 B2
(45) Date of Patent: Mar. 4, 2025

(54) FLUX RESIN COMPOSITION, ELECTRONIC COMPONENT, METHOD FOR MANUFACTURING THE ELECTRONIC COMPONENT, MOUNTING STRUCTURE, AND METHOD FOR MANUFACTURING THE MOUNTING STRUCTURE

(71) Applicant: Panasonic Intellectual Property Management Co., Ltd., Osaka (JP)

(72) Inventors: Shohei Sanada, Hyogo (JP); Shigeru Yamatsu, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 253 days.

(21) Appl. No.: 17/911,770

(22) PCT Filed: Mar. 3, 2021

(86) PCT No.: PCT/JP2021/008245
§ 371 (c)(1),
(2) Date: Sep. 15, 2022

(87) PCT Pub. No.: WO2021/187117
PCT Pub. Date: Sep. 23, 2021

(65) Prior Publication Data
US 2023/0141042 A1    May 11, 2023

(30) Foreign Application Priority Data

Mar. 17, 2020    (JP) ................................. 2020-046851

(51) Int. Cl.
*B23K 35/00*    (2006.01)
*B23K 35/36*    (2006.01)
(Continued)

(52) U.S. Cl.
CPC ........ *B23K 35/3613* (2013.01); *B23K 35/362* (2013.01); *C08G 59/226* (2013.01);
(Continued)

(58) Field of Classification Search
CPC .............. B23K 35/3613; B23K 35/362; B23K 2101/38; C08G 59/226; C08G 59/245;
(Continued)

(56) References Cited

U.S. PATENT DOCUMENTS

| 2011/0110050 A1* | 5/2011 | Sakatani | ............. | H01L 25/0657 |
| | | | | 361/749 |
| 2012/0217289 A1* | 8/2012 | Lee | ..................... | B23K 35/3601 |
| | | | | 148/23 |

(Continued)

FOREIGN PATENT DOCUMENTS

| JP | 2018-053056 A | 4/2018 |
| JP | 2018-053057 A | 4/2018 |

(Continued)

OTHER PUBLICATIONS

JP 2018053056A; English Translation (Year: 2018).*
ISR for PCT/JP2021/008245, dated May 25, 2021 (w/ translation).

*Primary Examiner* — Pete T Lee
(74) *Attorney, Agent, or Firm* — GREENBLUM & BERNSTEIN, P.L.C.

(57) ABSTRACT

A flux resin composition includes an epoxy resin, an imidazole compound, a thixo agent, and an activator. The epoxy resin includes at least one resin selected from the group consisting of naphthalene epoxy resins, biphenyl aralkyl epoxy resins, trisphenol methane epoxy resins, biphenyl epoxy resins, and dicyclopentadiene epoxy resins. The content of the at least one resin is equal to or greater than 20% by weight with respect to a total weight of the epoxy resin.

16 Claims, 5 Drawing Sheets

(51) Int. Cl.
*B23K 35/362* (2006.01)
*C08G 59/22* (2006.01)
*C08G 59/24* (2006.01)
*C08G 59/32* (2006.01)
*C08G 59/38* (2006.01)
*C08G 59/50* (2006.01)
*C08G 59/68* (2006.01)
*C08K 5/1575* (2006.01)
*C08K 5/20* (2006.01)
*H05K 1/18* (2006.01)
*B23K 101/38* (2006.01)

(52) U.S. Cl.
CPC ....... *C08G 59/245* (2013.01); *C08G 59/3218* (2013.01); *C08G 59/38* (2013.01); *C08G 59/5073* (2013.01); *C08G 59/685* (2013.01); *C08G 59/686* (2013.01); *C08K 5/1575* (2013.01); *C08K 5/20* (2013.01); *H05K 1/181* (2013.01); *B23K 2101/38* (2018.08); *H05K 2201/10734* (2013.01)

(58) Field of Classification Search
CPC ................ C08G 59/3218; C08G 59/38; C08G 59/5073; C08G 59/685; C08G 59/686; C08K 5/1575; C08K 5/20; H05K 1/181; H05K 2201/10734
See application file for complete search history.

(56) References Cited

U.S. PATENT DOCUMENTS

2012/0241965 A1* 9/2012 Hu .................... H01L 23/49816
 257/773
2015/0332983 A1 11/2015 Honda et al.
2017/0190005 A1 7/2017 Uehata et al.

FOREIGN PATENT DOCUMENTS

JP 2018-161673 A 10/2018
WO WO 2013/125684 A1 8/2013
WO WO 2015/146473 A1 10/2015

* cited by examiner

FLUX RESIN COMPOSITION, ELECTRONIC COMPONENT, METHOD FOR MANUFACTURING THE ELECTRONIC COMPONENT, MOUNTING STRUCTURE, AND METHOD FOR MANUFACTURING THE MOUNTING STRUCTURE

This application is the U.S. National Stage entry of PCT/JP2021/008245, filed Mar. 3, 2021, which claims priority to JP Application No. 2020-046851, filed Mar. 17, 2020, the disclosure of which is expressly incorporated by reference herein in its entirety.

TECHNICAL FIELD

The present disclosure generally relates to a flux resin composition, an electronic component, a method for manufacturing the electronic component, a mounting structure, and a method for manufacturing the mounting structure. More particularly, the present disclosure relates to a flux resin composition, an electronic component including a cured product of the flux resin composition and a method for manufacturing such an electronic component, and a mounting structure including a cured product of the flux resin composition and a method for manufacturing such a mounting structure.

BACKGROUND ART

A flux for use in soldering has the effect of chemically removing a metal oxide present on respective metallic surfaces of a solder alloy and an object to be soldered and thereby enabling a metallic element to move through the boundary between the solder alloy and the object to be soldered. Thus, performing soldering using the flux allows an intermetallic compound to be formed between the respective metallic surfaces of the solder alloy and the object to be soldered, thereby achieving a high bond strength between them. In general, a flux for use in soldering includes some components that are not decomposed or vaporized during a reflow process. Therefore, such components will be left as flux residues around the soldered portion after the soldering process.

In recent years, as the performance of automobiles has been further enhanced, onboard electronic devices have been built in such high-performance automobiles in increasing numbers and in a broader variety of locations. Under the circumstances such as these, the environment to which the onboard electronic devices are exposed has become increasingly severe. As a result, depending on their installation locations, those electronic devices are sometimes exposed to a heat cycle of −40° C. to 85° C. under their operating environment.

Meanwhile, extensive effort has recently been made to further reduce the size, and further enhance the performance, of those onboard devices, thus making soldering portions even narrower and smaller. That is to say, the parts themselves to be soldered together have been downsized so much that it has become increasingly difficult to ensure reliability for the heat cycle to be performed on the soldering portions.

To overcome such a problem, a method has been proposed to ensure sufficient reliability by reinforcing the soldering portions by covering the soldering portions with an underfilling material or a resin molding material. Such a method, however, requires cleaning up the flux residues before the reinforcement, which is sometimes a time- and cost-consuming job.

Thus, to eliminate the need for such cleaning, a method has been proposed to use the flux residues themselves as reinforcement by adding a thermosetting resin to the flux. Patent Literature 1 discloses a flux with the ability to not only reinforce the soldering portions but also eliminate the need for cleaning as well by adding a bisphenol A epoxy resin as a thermosetting resin and allowing the bisphenol A resin to cure after the soldering process.

CITATION LIST

Patent Literature

Patent Literature 1: WO 2015/146473 A1

SUMMARY OF INVENTION

The impact applied by the heat cycle to the soldering portions increases proportionally to the difference in coefficient of linear expansion between the objects to be soldered together. Thus, the impact is relieved with the reinforcement material. Nevertheless, a curable resin material for use as the reinforcement material generally has Tg (glass transition point), at which the coefficient of linear expansion increases steeply. Thus, to maximize the reinforcement effect to be achieved by the reinforcement material, Tg of the reinforcement material needs to be set at a temperature that is even higher than the temperature range of the heat cycle.

The flux of Patent Literature 1 contains an epoxy resin, and therefore, the shear strength of solder balls has a certain value. Nevertheless, the epoxy resin used by Patent Literature 1 is only a bisphenol A epoxy resin and contains plenty of long-chain dibasic acid. Thus, the cured product thereof (flux residues) sometimes has a low Tg and may have low heat cycle resistance. In addition, the long-chain dibasic acid is a compound that reacts to the epoxy resin, and therefore, is a flux which has poor storage stability and may cause a problem in continuous productivity.

An object of the present disclosure is to provide a flux resin composition, which may function as a flux, of which a cured product as a flux residue has a high glass transition point Tg, and which exhibits good storage stability.

A flux resin composition according to an aspect of the present disclosure includes an epoxy resin (A), an imidazole compound (B), a thixo agent (C), and an activator (D). The epoxy resin (A) includes at least one resin selected from the group consisting of naphthalene epoxy resins, biphenyl aralkyl epoxy resins, trisphenol methane epoxy resins, biphenyl epoxy resins, and dicyclopentadiene epoxy resins. Content of the at least one resin is equal to or greater than 20% by weight with respect to a total weight of the epoxy resin (A).

An electronic component according to another aspect of the present disclosure includes an electronic component body, a conductor, a bump of solder, and a reinforcing portion. The conductor is formed on a surface of the electronic component body. The bump is disposed on the conductor. The bump is also electrically connected to the conductor. The reinforcing portion is a cured product of the flux resin composition described above. The reinforcing portion reinforces a joint between the conductor and the bump.

A method for manufacturing an electronic component according to still another aspect of the present disclosure is a method for manufacturing the electronic component described above. The method includes curing the flux resin composition after adhering the flux resin composition onto the joint between the conductor and the bump.

A mounting structure according to yet another aspect of the present disclosure includes a circuit board, an electronic component, a bump of solder, and a reinforcing portion. The circuit board includes a first conductor. The electronic component includes a second conductor. The bump is interposed between the first conductor and the second conductor. The bump also electrically connects the first conductor and the second conductor to each other. The reinforcing portion is a cured product of the flux resin composition. The reinforcing portion reinforces at least one of a joint between the first conductor and the bump or a joint between the second conductor and the bump.

A method for manufacturing a mounting structure according to yet another aspect of the present disclosure is a method for manufacturing the mounting structure described above. The method includes curing the flux resin composition after adhering the flux resin composition onto at least one of the joint between the first conductor and the bump or the joint between the second conductor and the bump.

DESCRIPTION OF EMBODIMENTS

1. Overview

Figure 1:
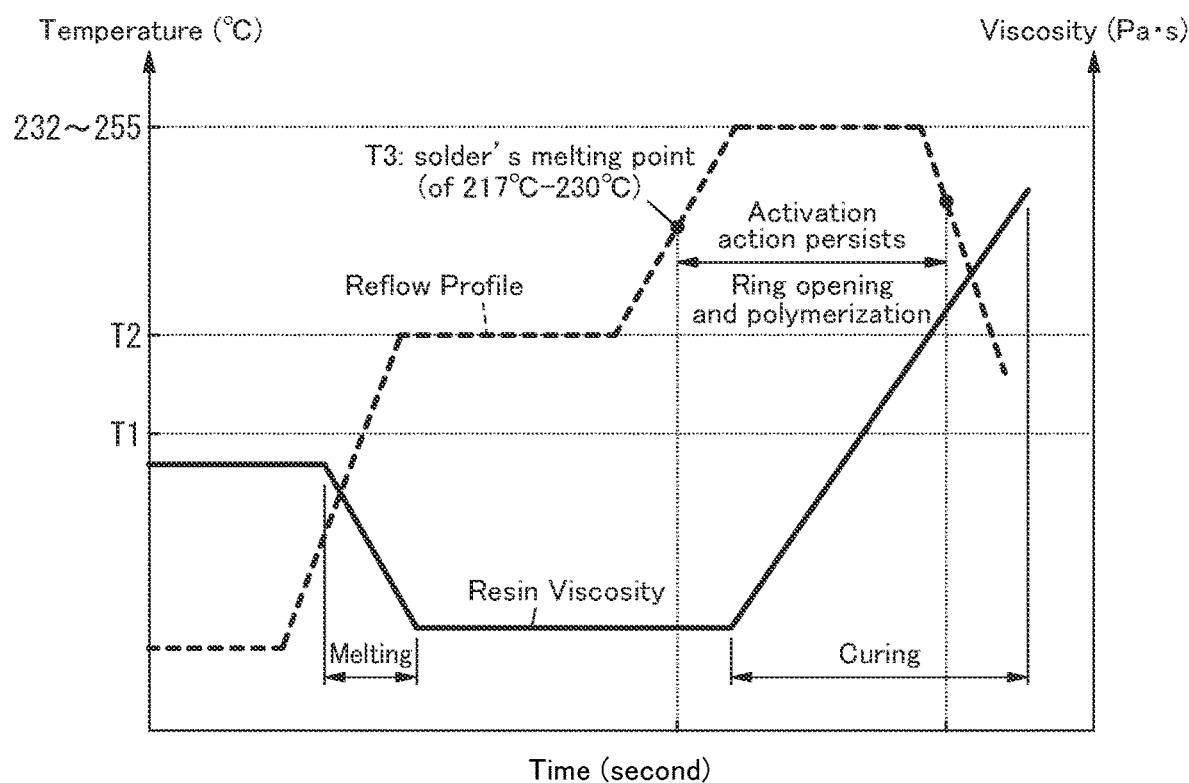
FIG. 1 is a graph showing an exemplary reflow profile when a flux resin composition according to an exemplary embodiment of the present disclosure and solder are heated.

A flux resin composition according to an exemplary embodiment (hereinafter also referred to as "composition (X)") includes an epoxy resin (A), an imidazole compound (B), a thixo agent (C), and an activator (D). The epoxy resin (A) includes at least one resin selected from the group consisting of naphthalene epoxy resins, biphenyl aralkyl epoxy resins, trisphenol methane epoxy resins, biphenyl epoxy resins, and dicyclopentadiene epoxy resins. The content of the at least one resin is equal to or greater than 20% by weight with respect to the total weight of the epoxy resin (A).

Each of the naphthalene epoxy resins, biphenyl aralkyl epoxy resins, trisphenol methane epoxy resins, biphenyl epoxy resins, and dicyclopentadiene epoxy resins has two or more cyclic structures in one molecule, and therefore, increases the chances of increasing the glass transition temperature (Tg) of the cured product, compared to an epoxy resin that does not have two or more cyclic structures in one molecule. This is probably because the presence of the cyclic skeletons restricts the movement of a molecular chain. Specifically, each of the naphthalene epoxy resins, biphenyl aralkyl epoxy resins, trisphenol methane epoxy resins, biphenyl epoxy resins, and dicyclopentadiene epoxy resins is likely to turn into a cured product having a glass transition temperature equal to or higher than 85° C.

In the flux resin composition according to this embodiment, when the bump and the conductor are connected together, the cured product thereof has so high a glass transition temperature that the reinforcing portion achieves a high degree of reliability and good storage stability, thus achieving the advantage of providing a flux resin composition with high productivity as well.

Also, as the imidazole compound (B), an imidazole compound having a melting point equal to or higher than 130° C. is preferably used. This reduces the chances of the imidazole compound (B) melting under a temperature lower than 130° C. Consequently, this decelerates the reaction between the epoxy resin (A) and the imidazole compound (B) and thereby improves the storage stability of the resin composition (X).

2. Details

Next, a resin composition (X), an electronic component 100 (see FIG. 2), a method for manufacturing the electronic component 100 (see FIGS. 3A-3C), a mounting structure 1 (see FIGS. 4A-4C), and a method for manufacturing the mounting structure 1 (see FIGS. 5A-5C) according to this embodiment will be described in detail.

2-1. Resin Composition (X)

The resin composition (X) according to this embodiment contains, as described above, an epoxy resin (A), an imidazole compound (B), a thixo agent (C), and an activator (D). These constituent components, namely, the epoxy resin (A), the imidazole compound (B), the thixo agent (C), and the activator (D), will be described in detail one by one below.

(1) Epoxy Resin (A)

The epoxy resin (A) is a compound having an epoxy group and has the property of being cured by heating. Therefore, the epoxy resin (A) may impart a thermosetting property to the resin composition (X). The epoxy resin (A) preferably has two or more epoxy groups in one molecule. This allows such an epoxy resin (A) to be cured more easily than an epoxy resin having only one epoxy group in one molecule.

The epoxy resin (A) is preferably liquid at a normal temperature. If the epoxy resin (A) is liquid at a normal temperature, then the epoxy resin (A) and the other components may be mixed more easily in the resin composition (X). Being liquid at a normal temperature means having flowability under the atmospheric pressure and at an ambient temperature within the range from 5° C. to 28° C. (particularly around 20° C.). In order for the epoxy resin (A) to be liquid at the normal temperature, the epoxy resin (A) may include only components that are in liquid state at the normal temperature. Alternatively, the epoxy resin (A) may include a component that is in liquid state at the normal temperature and a component that is not in liquid state at the normal temperature. Still alternatively, the epoxy resin (A) may be in liquid state at the normal temperature due to the presence of, for example, a reactive diluent or a solvent.

The epoxy resin (A) includes an epoxy resin (A1) and an epoxy resin (A2) other than the epoxy resin (A1).

The epoxy resin (A1) includes at least one resin selected from the group consisting of naphthalene epoxy resins, biphenyl aralkyl epoxy resins, trisphenol methane epoxy resins, biphenyl epoxy resins, and dicyclopentadiene epoxy resins. This makes it easier to increase the glass transition temperature of the resin composition (X) that has been cured.

The naphthalene epoxy resin is an epoxy resin having one or more naphthalene skeletons in one molecule. The naphthalene skeletons with rigidity and hydrophobicity may increase the glass transition temperature of the cured product of the resin composition (X).

The biphenyl aralkyl epoxy resin is an epoxy resin having one or more aralkyl skeletons, each having a biphenyl group, in one molecule. The biphenyl aralkyl epoxy resin has a rigid biphenyl group in its aralkyl skeleton(s), thus increasing the glass transition temperature of the cured product of the resin composition (X).

The trisphenol methane epoxy resin is an epoxy resin with three epoxy groups, each having a phenyl methane skeleton, in one molecule, and has so high a functional group (epoxy group) density as to increase the glass transition temperature of the cured product of the resin composition (X).

The dicyclopentadiene epoxy resin is an epoxy resin having one or more dicyclopentadiene skeletons in one molecule. The dicyclopentadiene epoxy resin has a rigid dicyclopentadiene skeleton, thus increasing the glass transition temperature of the cured product of the resin composition (X).

The epoxy resin (A1) preferably has an epoxy group equivalent equal to or greater than 100 and equal to or less than 500.

Examples of the epoxy resin (A1) include: a naphthalene epoxy resin expressed by the following Formula (1) (such as HP-4302D (manufactured by DIC Corporation; semi-solid state)); a naphthalene epoxy resin expressed by the following Formula (2) (such as HP-4700 (manufactured by DIC Corporation and having a softening point of 85° C. to 95° C.) and HP-4710 (manufactured by DIC Corporation and having a softening point of 85° C. to 105° C.)); a naphthalene epoxy resin expressed by the following Formula (3) (such as EXA-4750 (manufactured by DIC Corporation and having a softening point of 80° C.)); a naphthalene epoxy resin expressed by the following Formula (4) (such as HP-4770 (manufactured by DIC Corporation and having a softening point of 67° C. to 77° C.)); and a mixture of a naphthalene epoxy resin expressed by the following Formula (5) (such as HP-6000 (manufactured by DIC Corporation and having a softening point of 65° C. to 85° C.) and a naphthalene epoxy resin expressed by the following Formula (6) (such as HP-6000L (manufactured by DIC Corporation and having a softening point of 59° C.)).

Examples of the epoxy resin (A1) further include: a trisphenol methane epoxy resin expressed by the following Formula (7) (such as HP-7241 (manufactured by DIC Corporation and having a softening point of 66° C.)); a trisphenol methane epoxy resin expressed by the following Formula (8) (such as HP-7250 (manufactured by DIC Corporation and having a semi-solid state)); and a trisphenol methane epoxy resin expressed by the following Formula (9) (such as EPPN-501H (manufactured by Nippon Kayaku Co., Ltd. and having a softening point of 51° C. to 57° C.), EPPN-501HY (manufactured by Nippon Kayaku Co., Ltd. and having a softening point of 57° C. to 63° C.), and EPPN-502H (manufactured by Nippon Kayaku Co., Ltd. and having a softening point of 60° C. to 72° C.)).

Examples of the epoxy resin (A1) further include a biphenyl aralkyl epoxy resin expressed by the following Formula (10) (such as NC-3000 (manufactured by Nippon Kayaku Co., Ltd. and having a softening point of 53° C. to 63° C.), NC-3000L (manufactured by Nippon Kayaku Co., Ltd. and having a softening point of 45° C. to 60° C.), NC-3000-H (manufactured by Nippon Kayaku Co., Ltd. and having a softening point of 65° C. to 75° C.), and NC-3100 (manufactured by Nippon Kayaku Co., Ltd. and having a softening point of 90° C. to 103° C.)).

Examples of the epoxy resin (A1) further include a biphenyl epoxy resin expressed by the following Formula (11) (such as YH4000 (manufactured by Mitsubishi Chemical Corporation and having a softening point of 105° C.) and YX4000H (manufactured by Mitsubishi Chemical Corporation and having a softening point of 105° C.)).

Examples of the epoxy resin (A1) further include a dicyclopentadiene epoxy resin expressed by the following Formula (12) (such as HP-7200 (manufactured by DIC Corporation and having a softening point of 56° C. to 66° C.), HP-7200L (manufactured by DIC Corporation and having a softening point of 50° C. to 60° C.), HP-7200H (manufactured by DIC Corporation and having a softening point of 78° C. to 88° C.), HP-7200HH (manufactured by DIC Corporation and having a softening point of 88° C. to 98° C.), HP-7200HHH (manufactured by DIC Corporation and having a softening point of 100° C. to 110° C.), and XD-1000 (manufactured by Nippon Kayaku Co., Ltd. and having a softening point of 68° C. to 78° C.)).

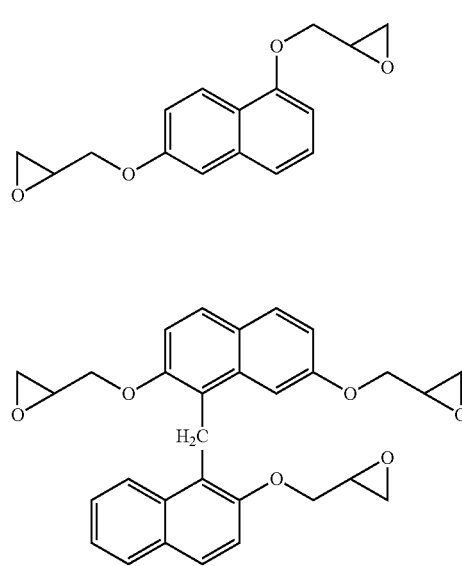

-continued
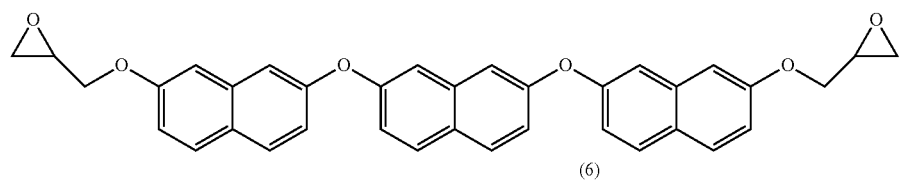
(5)
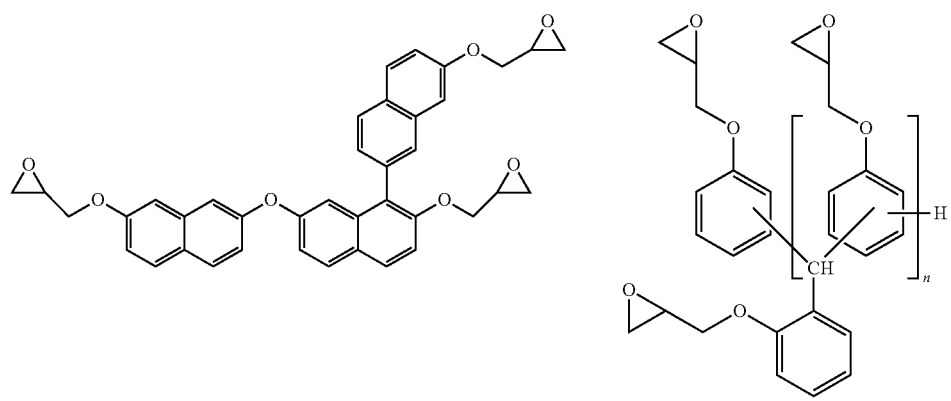
(6)
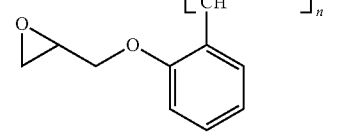
(7)
where n indicates an integer falling within the range from 1 to 10.
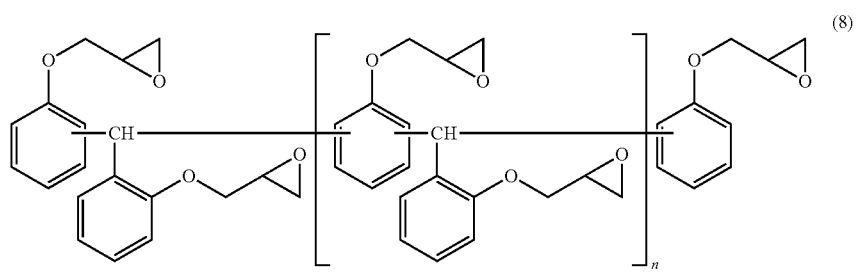
(8)
where n indicates an integer falling within the range from 1 to 10.
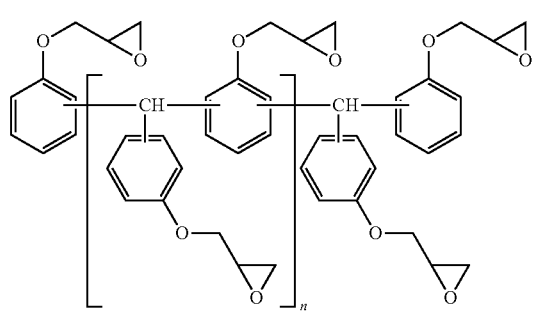
(9)
where n indicates an integer falling within the range from 1 to 10.
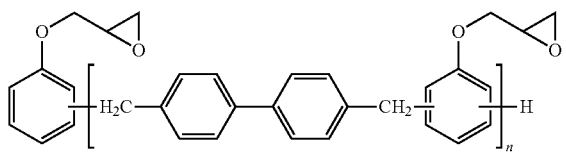
(10)
where n indicates an integer falling within the range from 1 to 10.
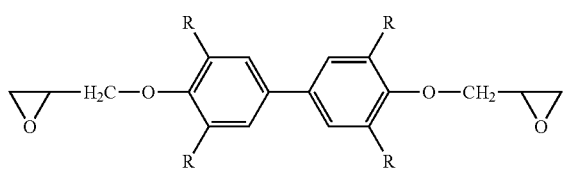
(11)
where R indicates a methyl group.

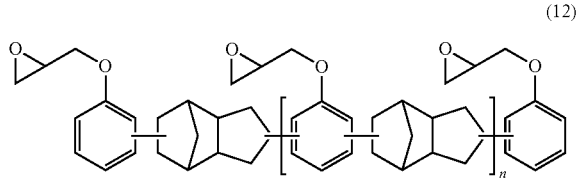

(12)

where n indicates an integer falling within the range from 1 to 10.

The epoxy resin (A2) may include one or more components selected from the group consisting of: glycidyl ether epoxy resins; glycidyl amine epoxy resins; glycidyl ester epoxy resins; olefin oxidation (alicyclic) epoxy resins; bisphenol epoxy resins such as bisphenol A epoxy resins and bisphenol F epoxy resins; hydrogenated bisphenol epoxy resins such as hydrogenated bisphenol A epoxy resins and hydrogenated bisphenol F epoxy resins; alicyclic epoxy resins; phenol-novolac epoxy resins; cresol-novolac epoxy resins; aliphatic epoxy resins; and triglycidyl isocyanurate.

The epoxy resin (A2) particularly preferably includes any one of a bisphenol A epoxy resin, a bisphenol F epoxy resin, a hydrogenated bisphenol A epoxy resin, or a hydrogenated bisphenol F epoxy resin. This makes it easier to lower the viscosity of the resin composition (X) and thereby improve the physical properties of a cured product of the resin composition (X).

The proportion of the epoxy resin (A1) to the entire epoxy resin (A) is preferably equal to or greater than 20% by weight. This enables increasing the glass transition temperature of a cured product of the resin composition (X). The proportion of the epoxy resin (A1) to the entire epoxy resin (A) is more preferably equal to or greater than 25% by weight and particularly preferably equal to or greater than 30% by weight. Note that if the entire epoxy resin (A) consists of the epoxy resin (A1), then the epoxy resin (A) would turn into solid and could not be supplied in some cases. Thus, the epoxy resin (A1) preferably accounts for 80% by weight or less of the entire epoxy resin (A). Also, the rest of the epoxy resin (A) other than the epoxy resin (A1) may be the epoxy resin (A2).

(2) Imidazole Compound (B)

The imidazole compound (B) is a curing agent of the epoxy resin (A). The resin composition (X) needs to be cured after having served as a flux during the reflow process. In this embodiment, the imidazole compound (B) has so high a melting point that it is difficult for the imidazole compound (B) to serve as a curing agent in a temperature range from room temperature to the melting point of the solder bump, thus retarding the curing reaction of the epoxy resin. This allows the resin composition (X) to serve as a flux in the meantime. After that, as the temperature is further increased to a temperature equal to or higher than the melting point of the solder bump, the imidazole compound (B) will start to serve as a curing agent after soldering has been done. Thus, the ring-opening polymerization proceeds between the epoxy resin (A) and the imidazole compound (B), thus causing the resin composition (X) to be cured. Then, after having been cured, the resin composition (X) will serve as a reinforcing portion 4.

The imidazole compound (B) is preferably solid having a melting point equal to or higher than 130° C. In that case, at a temperature lower than 130° C. (e.g., at 25° C.), the imidazole compound (B) is not melted easily but remains solid, and therefore, mixes with the epoxy resin (A) less easily, compared to a situation where the imidazole compound (B) is liquid. This may reduce the reaction between the epoxy resin (A) and the imidazole compound (B).

The imidazole compound (B) may be one or more imidazole compounds selected from the group consisting of, for example: 2-methyl imidazole (product number 2MZ-H manufactured by Shikoku Chemicals Corporation and having a melting point of 140-148° C.); 2-phenyl imidazole (product numbers 2W, 2PZ-PW manufactured by Shikoku Chemicals Corporation and having a melting point of 137-147° C.); 2-phenyl-4-methyl imidazole (product number 2P4MZ manufactured by Shikoku Chemicals Corporation and having a melting point of 174-184° C.); 2,4-diamino-6-[2'-methylimidazolyl-(1')]-ethyl-s-triazine (product numbers 2MZ-A, 2MZA-PW manufactured by Shikoku Chemicals Corporation and having a melting point of 248-268° C.); 2,4-diamino-6-[2'-undecylimidazolyl-(1')]-ethyl-s-triazine (product number C11Z-A manufactured by Shikoku Chemicals Corporation and having a melting point of 187-195° C.); 2,4-diamino-6-[2'-ethyl-4'-methylimidazolyl-(1')]ethyl-s-triazine (product number 2E4MZ-A manufactured by Shikoku Chemicals Corporation and having a melting point of 215-225° C.); an isocyanurate adduct of 2,4-diamino-6-[2'-methylimidazolyl-(1')]-ethyl-s-triazine (product numbers 2MA-OK, 2MAOK-PW manufactured by Shikoku Chemicals Corporation and having a melting point of 260° C.); an isocyanurate adduct of 2-phenyl imidazole (product number 2W-OK manufactured by Shikoku Chemicals Corporation and having a melting point of 140° C.); 2-phenyl-4,5-dihydroxymethyl imidazole (product number 2PHZ-PW manufactured by Shikoku Chemicals Corporation and having a melting point of 230° C.); and 2-phenyl-4-methyl-5-hydroxymethyl imidazole (product number 2P4MHZ-PW manufactured by Shikoku Chemicals Corporation and having a melting point of 191-195° C.).

The form of the solid imidazole compound (B) is preferably, but does not have to be, powder, granule, or particle, for example. This makes it easier to not only reduce the reaction of the resin composition (X) at room temperature but also rapidly cure the resin composition (X) at the time of the reflow process. If the imidazole compound (B) is in the form of powder, for example, its mean particle size is preferably, but does not have to be, equal to or greater than 0.5 μm and equal to or less than 50 μm. Note that as the mean particle size, a median diameter (D50) of a particle size distribution obtained by laser diffraction/scattering method may be adopted, for example.

(3) Thixo Agent (C)

The thixo agent (C) is a compound that imparts a thixo property to the resin composition (X). As used herein, the "thixo property" refers to a property that causes the substance to have a decreased viscosity when subjected to a shear stress. The thixo property is quantified by a thixo ratio and may be obtained by, for example, measuring, using a rotational viscometer, two viscosities with the number of revolutions of the viscometer changed at a constant temperature and calculating the ratio of the two viscosities. The numbers of revolutions of the rotational viscometer may be 2.5 rpm and 10 rpm at 25° C., for example.

The resin composition (X) preferably has, at 25° C. and 10 rpm, a viscosity equal to or greater than 35 Pa·s and equal to or less than 280 Pa·s and a thixo ratio equal to or greater than 1.5 and equal to or less than 5.5.

The thixo agent (C) may be one or more substances selected from the group consisting of, for example: 1,3:2,4-bis-O-benzylidene-D-glucitol (dibenzylidene sorbitol) (product name: Gelol D manufactured by New Japan Chemical Co., Ltd.); 1,3:2,4-bis-O-(4-methylbenzylidene)-D-sorbitol (product name: Gelol MD manufactured by New Japan Chemical Co., Ltd.); and N, N'-methylene bis(stearamide) (product name Bisamide LA manufactured by Mitsubishi Chemical Corporation).

(4) Activator (D)

The activator (D) has the function of removing a metal oxide film. Therefore, adding the activator (D) to the resin composition (X) may impart a flux action to the resin composition (X). As used herein, the "flux action" means a reduction action of removing an oxide film formed on the surface of a metal to which solder is applied, and the action of lowering the surface tension of the molten solder and improving the wettability of the solder to the bonding metal surface.

The activator (D) preferably includes at least one of an organic acid (D1) having a carboxyl group equivalent equal to or greater than 40 g/mol and equal to or less than 400 g/mol and a melting point equal to or lower than 220° C. or an amine (D2) having a nitrogen atom equivalent equal to or greater than 10 g/mol and equal to or less than 300 g/mol and a melting point equal to or lower than 220° C. Using such an activator (D) with a melting point equal to or lower than 220° C. allows, even when solder having a melting point of around 200° C. or equal to or higher than 200° C. is used, an oxide film of the solder to be removed before the solder is melted. As used herein, the "carboxyl group equivalent" refers to a value represented by the ratio of the molar molecular weight (g) to the number of carboxyl groups (mol) per molecule and the "nitrogen atom equivalent" refers to a value represented by the ratio of the molar molecular weight (g) to the number of nitrogen atoms (mol) per molecule.

The organic acid (D1) may include, for example, one or more substances selected from the group consisting of a rosin component material, adipic acid, glutaric acid, succinic acid, malonic acid, citric acid, suberic acid (cork acid), sebacic acid, and pimelic acid. The organic acid (D1) preferably includes, among other things, succinic acid (having a carboxyl group equivalent of 59 g/mol), glutaric acid (having a carboxyl group equivalent of 66 g/mol), adipic acid (having a carboxyl group equivalent of 73 g/mol), suberic acid (cork acid) (having a carboxyl group equivalent of 87 g/mol), sebacic acid (having a carboxyl group equivalent of 101 g/mol), and Tsunodime 395 (having a carboxyl group equivalent of 288 g/mol).

The amine (D2) is not limited to any particular one as long as the amine may be used as a flux, but may include, for example, one or more substances selected from the group consisting of various amine salts, alkanolamine, and guanidine. The amine (D2) particularly preferably includes, among other things, diethanolamine (having a nitrogen atom equivalent of 105 g/mol), triethanolamine (TEA) (having a nitrogen atom equivalent of 149 g/mol), triisopropanolamine (having a nitrogen atom equivalent of 191 g/mol), 1,3-diphenylguanidine (having a nitrogen atom equivalent of 70 g/mol), and 1,3-di-o-tolylguanidine (having a nitrogen atom equivalent of 80 g/mol).

The activator (D) may include some additional components other than the organic acid (D1) and the amine (D2). The activator (D) may include an organic acid or an amine having a melting point higher than 220° C.

(5) Other Components (E)

The resin composition (X) may include additional components other than the epoxy resin (A), the imidazole compound (B), the thixo agent (C), and the activator (D). Examples of those other components (E) may include a component modifier such as rosin, a filler, and a solvent.

(6) Contents of Respective Components

In the resin composition (X), with respect to 100% by weight in total of the epoxy resin (A), the imidazole compound (B), the thixo agent (C), and the activator (D), the proportion of the epoxy resin (A) is preferably equal to or greater than 70% by weight and equal to or less than 94.7% by weight. This enables increasing the glass transition temperature of the resin composition (X) that has been cured, thus improving the storage stability of the resin composition (X). The proportion of the epoxy resin (A) is more preferably equal to or greater than 72.5% by weight and equal to or less than 92.5% by weight, and particularly preferably equal to or greater than 75% by weight and equal to or less than 90% by weight, with respect to 100% by weight in total of the epoxy resin (A), the imidazole compound (B), the thixo agent (C), and the activator (D).

The proportion of the epoxy resin (A1) is more preferably equal to or greater than 17.5% by weight and equal to or less than 70% by weight, and particularly preferably equal to or greater than 20% by weight and equal to or less than 67.5% by weight, with respect to 100% by weight in total of the epoxy resin (A), the imidazole compound (B), the thixo agent (C), and the activator (D). This enables increasing the glass transition temperature of a cured product of the resin composition (X).

In the resin composition (X), with respect to 100% by weight in total of the epoxy resin (A), the imidazole compound (B), the thixo agent (C), and the activator (D), the proportion of the imidazole compound (B) is preferably equal to or greater than 0.05% by weight and equal to or less than 2.4% by weight, and particularly preferably equal to or greater than 0.075% by weight and equal to or less than 2.35% by weight. This improves the storage stability of the resin composition (X).

In the resin composition (X), with respect to 100% by weight in total of the epoxy resin (A), the imidazole compound (B), the thixo agent (C), and the activator (D), the proportion of the thixo agent (C) is preferably equal to or greater than 0.75% by weight and equal to or less than 5.55% by weight. This enables making the viscosity at 25° C. and 10 rpm equal to or greater than 35 Pa·s and equal to or less than 280 Pa·s and making the thixo ratio (as a ratio of 2.5 rpm/10 rpm) equal to or greater than 1.5 and equal to or less than 5.5, thus making the resin composition (X) applicable to printing, transfer, and feeding methods using a dispenser, for example. If the thixo ratio were less than 1.5, then it would be difficult to maintain the shape of the resin composition (X) that has been fed for printing, thus increasing the chances of causing a bridge. On the other hand, if the content of the thixo agent (C) were so much as to make the thixo ratio greater than 5.5, then it would be difficult to remove the resin composition (X) from a printing mask, thus increasing the chances of causing chipping. The proportion of the thixo agent (C) is particularly preferably equal to or greater than 0.9% by weight and equal to or less than 5.3% by weight, thus enabling making the viscosity at 25° C. and 10 rpm equal to or greater than 40 Pa·s and equal to or less than 260 Pa·s and making the thixo ratio equal to or greater than 2 and equal to or less than 5.

In the resin composition (X), with respect to 100% by weight in total of the epoxy resin (A), the imidazole compound (B), the thixo agent (C), and the activator (D), the proportion of the activator (D) is preferably equal to or greater than 4.25% by weight and equal to or less than 23% by weight and particularly preferably equal to or greater than 4.75% by weight and equal to or less than 22% by weight. This enables imparting a flux property to the resin composition (X), thus improving the storage stability.

(7) Property

In the resin composition (X) according to this embodiment, the time it takes for a value calculated by (viscosity of the resin composition after storage/viscosity of the resin composition at the beginning of the storage)×100(%) to reach 120% since the resin composition has started to be stored at 25° C. is equal to or longer than 24 hours (which is a property corresponding to the "life" to be described later), and therefore, the resin composition (X) has excellent storage stability. In addition, the resin composition (X) according to this embodiment allows solder balls to have a wet spreadability before and after the reflow process (which is a property corresponding to the "wet spreadability" to be described later) of 50% or more, thus achieving good solder wettability during the reflow process. Furthermore, in the resin composition (X) according to this embodiment, a cured product thereof has a glass transition temperature equal to or higher than 85° C. (which is a property corresponding to the "glass transition temperature (Tg)" to be described later), thus allowing the cured product to achieve excellent reinforcement effect at the solder-bonded portion.

2-2. Electronic Component and its Manufacturing Method

The configuration of an electronic component 100 to which the resin composition (X) is applied, and a manufacturing method thereof will be described below.

(1) Configuration of Electronic Component

Figure 2:
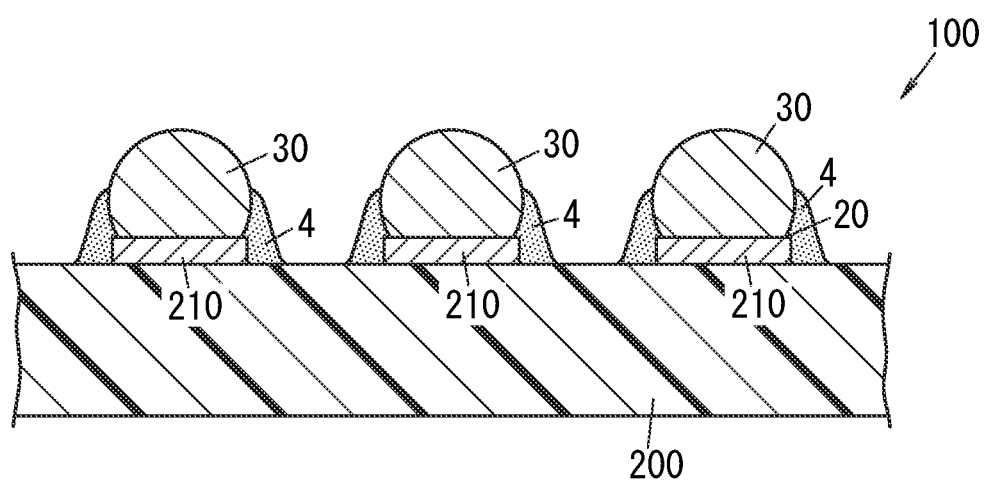
FIG. 2 is a schematic cross-sectional view illustrating an exemplary electronic component according to the exemplary embodiment of the present disclosure.

The electronic component 100 according to this embodiment will be described with reference to FIG. 2. Note that the configuration of the electronic component 100 to be described below is only an example and should not be construed as limiting.

The electronic component 100 may be, but does not have to be, a surface-mount semiconductor chip, for example. The semiconductor chip may be, but does not have to be, a BGA (ball-grid array) or a WLP (wafer level package), for example.

The electronic component 100 includes an electronic component body 200, a conductor 210, solder bumps 30, and reinforcing portions 4.

The conductor 210 is formed on the surface of the electronic component body 200, and therefore, exposed to the outside on the surface of the electronic component body 200. If the electronic component 100 is a WLP, the electronic component body 200 includes, for example, a silicon substrate with a rewiring layer, and the conductor 210 is, for example, pillars electrically connected to the rewiring layer. If the electronic component 100 is a BGA, the electronic component body 200 is, for example, a package formed by encapsulating a die (chip) mounted on a substrate with an encapsulation resin, and the conductor 210 is, for example, electrode pads electrically connected to the die. The structure of the electronic component body 200 may be modified appropriately according to the type of the electronic component 100 and should not be construed as limiting.

The bumps 30 are arranged on, and electrically connected to, the conductor 210. Therefore, a joint 20 is formed between each bump 30 and the conductor 210. The bumps 30 may be, but do not have to be, made of, for example, SAC solder, or tin-copper based (Sn—Bi based) solder. The Sn—Bi based solder may contain, in addition to Sn and Bi, at least one material selected from the group consisting of Ag, Ni, Fe, Ge, Cu and In. To improve the mechanical performance of the Sn—Bi based solder, the Sn—Bi based solder preferably contains at least one material selected from the group consisting of Ag, Ni, Fe, and Ge.

The reinforcing portions 4 are a cured product of the resin composition (X). In the electronic component 100, the reinforcing portions 4 are adhered to the outside of the respective joints 20 between the bumps 30 and the conductor 210. In other words, in the electronic component 100, a cured product of the resin composition (X) is adhered to the outside of the respective joints 20 between the bumps 30 and the conductor 210. Therefore, the reinforcing portions 4 allow reinforcing the joints 20 between the bumps 30 and the conductor 210 and thereby improving the connection reliability of the electronic component 100.

(2) Manufacturing Method of Electronic Component

A manufacturing method of the electronic component 100 will be described with reference to FIGS. 3A-3C.

Figure 3A:
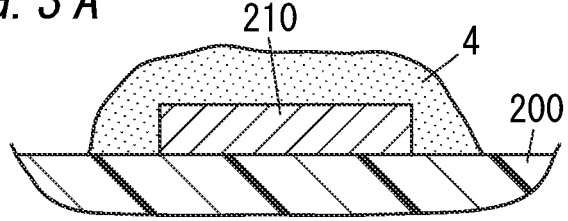
FIGS. 3A-3C are schematic cross-sectional views illustrating an exemplary manufacturing method of the electronic component.

First, an electronic component body 200 including a conductor 210 is provided and the resin composition (X) is disposed to cover the conductor 210 (see FIG. 3A). The method of disposing the resin composition (X) may be, but does not have to be, for example, a printing method such as an inkjet method or a transfer method.

Figure 3B:
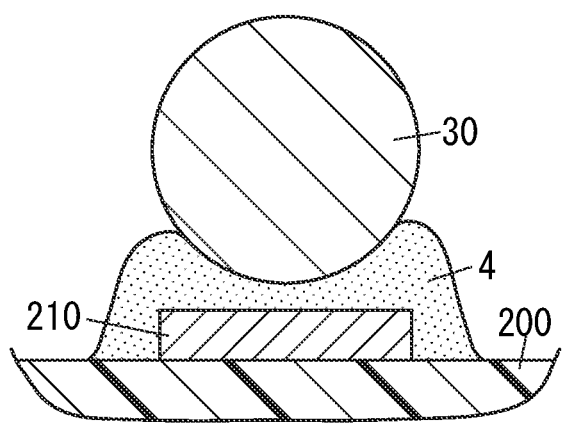
Figure 3C:
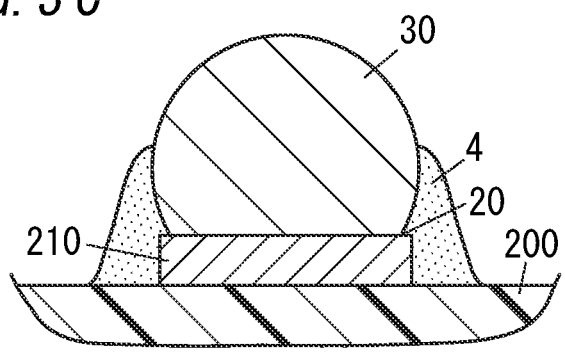

Next, a bump 30 is disposed over the conductor 210 to bring the bump 30 into contact with the resin composition (X) (see FIG. 3B). As the bump 30, a solder ball may be used, for example.

Subsequently, the bump 30 and the resin composition (X) are heated in the state shown in FIG. 3B. The heating method may be, but does not have to be, heating with a reflow furnace, for example. In that case, the bump 30 and the resin composition (X) may be heated following, for example, the reflow profile as shown in FIG. 1.

The flux property imparted by the resin composition (X) and a method of making a reinforcing portion to reinforce the joint between a conductor and a solder bump will now be described.

A conductor and a solder bump may be electrically connected to each other by placing the bump over the conductor and melting the bump. The joint between the conductor and the bump may be reinforced by adhering a cured product of the resin composition (X) to the joint between the conductor and the bump. For example, as the bump and the resin composition (X) are heated in a state where the resin composition (X) is placed between the conductor and the bump, the viscosity of the resin composition (X) decreases, causing the resin composition (X) to serve as a flux while flowing. As the resin composition (X) flows, the bump comes into contact with the conductor. The bump melts and adheres to the conductor while the resin composition (X) maintains its flowability. At this time, the resin composition (X) adheres to the outside of the joint between the conductor and the bump and is cured in that state to form the reinforcing portion. In this manner, the conductor and the bump may be electrically connected to each other and the joint between the conductor and the bump may be reinforced by adhering the reinforcing portion that is a cured product of the resin composition (X) to the outside of the joint. In order to melt the bump, the bump and the resin composition (X) are heated to a temperature higher than the melting point of the solder.

An exemplary heating temperature profile and a typical variation in the viscosity of the resin composition (X) when the conductor and the bump are electrically connected to each other while the reinforcing portion is being formed are shown in the graph of FIG. 1. In the graph of FIG. 1, the dashed curve indicates the heating temperature, and the solid curve indicates the viscosity of the resin composition (X). In FIG. 1, T3 (° C.) is the melting point of the bump, and T1 (° C.) and T2 (° C.) are particular temperatures that meet the relation: room temperature<T1<T2<T3.

First, as shown in FIG. 1, the heating temperature is increased from room temperature to T1 (° C.). Next, the heating temperature is increased to T2 (° C.). Then, the heating temperature is increased to a temperature higher than T3 (° C.) (i.e., increased to a peak temperature). Subsequently, the heating temperature is lowered to room temperature.

The melting point T3 (° C.) of the bump depends on the composition of the solder as a constituent material of the bump. For instance, if the bump is made of an Sn—Ag—Cu (SAC) based solder, T3 (° C.) is equal to or higher than 217° C. and equal to or lower than 230° C.

T1 (° C.) is preferably defined around the temperature at which the resin composition (X) starts melting. T1 (° C.) may be, but does not have to be, equal to or higher than 140° C. and equal to or lower than 160° C., for example.

T2 (° C.) is preferably defined to be a temperature higher than T1 (° C.) and lower than the temperature at which the resin composition (X) starts curing. T2 (° C.) may be, but does not have to, equal to or higher than 160° C. and equal to or lower than 200° C., for example. The peak temperature is preferably defined to be a temperature higher than T3 (° C.) and higher than the temperature at which the resin composition (X) starts curing. The peak temperature may be, but does not have to be, equal to or higher than 232° C. and equal to or lower than 255° C., for example. The temperature increase rate of the heating temperature at which the heating temperature rises from room temperature to T1 (° C.) may be, but does not have to be, equal to or less than 5° C./second, for example. The time it takes for the heating temperature to rise from T1 (° C.) to T2 (° C.) may be, but does not have to be, equal to or longer than 60 seconds and equal to or shorter than 100 seconds, for example. The temperature increase rate at which the heating temperature rises from T2 (° C.) to the peak temperature (° C.) may be, but does not have to be, equal to or less than 4° C./second, for example. The duration for which the heating temperature remains equal to or higher than T3 (° C.) may be, but does not have to be, equal to or longer than 30 seconds and equal to or shorter than 90 seconds, for example.

As shown in FIG. 1, from around T1 (° C.), the viscosity of the resin composition (X) starts to decrease to cause the resin composition (X) to start flowing. In FIG. 1, "melting" refers to melting of the epoxy resin (A). Therefore, the time it takes for the resin composition (X) to start flowing since the start of the heating may be controlled by controlling the temperature increase rate of the heating temperature from room temperature to T1 (° C.). As shown in FIG. 1, even if the heating temperature is increased from T1 (° C.) to T2 (° C.), the resin composition (X) is maintained at a low viscosity. Thus, the duration for which the resin composition (X) maintains flowability may be controlled by controlling the temperature increase rate from T1 (° C.) to T2 (° C.). This allows the resin composition (X) to flow smoothly enough to reduce the chances of causing voids in the reinforcing portion 4.

As shown in FIG. 1, as the heating temperature rises from T2 (° C.) toward the peak temperature, the viscosity of the resin composition (X) hardly increases, and the state in which the resin composition (X) has flowability is maintained for a while even after the heating temperature has exceeded T3 (° C.). Subsequently, the viscosity starts to increase steeply. That is to say, this makes it easier, even after the heating temperature has exceeded the melting point of the solder, for the resin composition (X) to maintain flowability for a while. Therefore, flowing of the resin composition (X) makes it easier for the bump to come into contact with the conductor and to be melted and adhered to the bump. In addition, this reduces the chances of the resin composition (X) inhibiting a self-alignment effect of the melted bump. Furthermore, since the resin composition (X) contains the activator (D), the oxide film of the solder may be quickly removed by the flux action of the activator (D) while the heating temperature rises from T2 (° C.) to T3 (° C.) to cause the resin composition (X) to be cured. Even after the viscosity of the resin composition (X) has increased with the ring opening and polymerization of the epoxy resin (A), the activation action of the activator (D) still persists as shown in FIG. 1. This allows the conductor and the solder to be connected smoothly, thus further reducing the chances of causing a contact failure.

The ring opening of the epoxy group with the resin composition (X) adhered to the joint between the conductor and the solder causes polymerization. Thus, the reinforcing portion adhered to the outside (outer surface) of the joint between the conductor and the solder is formed by causing the resin composition (X) to be cured. As shown in FIG. 1, the viscosity of the resin composition (X) continues increasing even if the heating temperature has fallen from the peak temperature toward room temperature. Therefore, the resin composition (X) may be rapidly cured with the resin composition (X) still adhered to the outside of the joint between the conductor and the solder.

Such viscosity behavior is realized by the resin composition (X) probably because the imidazole compound (B) has a high melting point. The curing reaction of the resin composition (X) hardly proceeds, and the low viscosity of the resin composition (X) may be maintained, in the range from T1 (° C.) to T3 (° C.), since the melting point of the imidazole compound (B) is equal to or higher than 130° C.

The resin composition (X) is rapidly cured, even if the heating temperature has fallen from the peak temperature toward room temperature. This is not because the temperature of the resin composition (X) falls steeply but because the resin composition (X) maintains, for a certain period of time, a temperature high enough to cause the curing reaction between the epoxy resin (A) and the imidazole compound (B) to proceed. Thus, a cured product of a resin composition (X) in which an ideal three-dimensional crosslinked structure is formed, and which has a high glass transition temperature (Tg) is obtained. Applying such a resin composition (X) to the electronic component 100 shown in FIG. 2 enables forming a reinforcing portion 4 adhered to the outside of the joint 20 between the conductor 210, included in the electronic component body 200, and the bump 32.

Figure 4A:
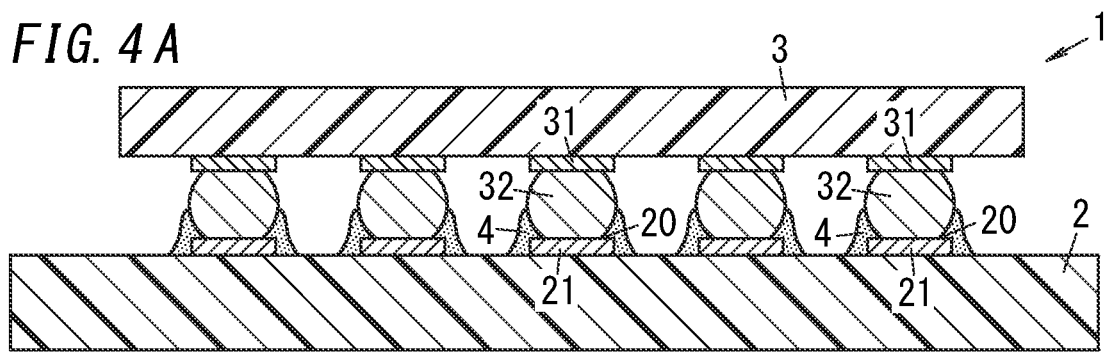
FIGS. 4A-4C are schematic cross-sectional views illustrating exemplary mounting structures according to the exemplary embodiment of the present disclosure.

Furthermore, applying the resin composition (X) to the mounting structure 1 shown in FIG. 4A enables forming a reinforcing portion 4 adhered to the joint 20 between the first conductor 21 and the bump 32, when connecting the first conductor 21 of the circuit board 2 to the bump 32.

The resin composition (X) according to this embodiment may be used to form, after the conductor and the bump have been electrically connected to each other, a reinforcing portion covering the joint between the conductor and the bump.

As described above, the resin composition (X) will be maintained at a low viscosity until the bump 30 melts. In addition, even after the bump 30 has started melting, the viscosity of the resin composition (X) does not increase immediately but starts to increase steeply after a while. This allows the resin composition (X) to start to be cured after the resin composition (X) has been adhered to the outside of the joint 20 between the conductor 210 and the bump 30. Thus, the conductor 210 and the bump 30 may be connected as intended. Consequently, this reduces the chances of causing a contact failure between the conductor 210 and the bump 30. In addition, this also allows a cured product of the resin composition (X) to be adhered to the outside of the joint 20 between the conductor 210 and the bump 30. In this manner, the joint 20 between the conductor 210 and the bump 30 may be reinforced.

2-3. Mounting Structure and its Manufacturing Method (1) Mounting Structure

A mounting structure 1 according to this embodiment will be described with reference to FIGS. 4A-4C. Note that the configuration of the mounting structure 1 to be described below is only an example and should not be construed as limiting.

The mounting structure 1 includes a circuit board 2, an electronic component 3, bumps 32, and reinforcing portions 4.

The circuit board 2 may be a motherboard, a package board, or an interposer board, for example. The circuit board 2 may be, for example, an insulating board made of glass epoxy, polyimide, polyester, a ceramic, or any other suitable material. A first conductor 21 is formed on the surface of the circuit board 2. Thus, the circuit board 2 includes the first conductor 21. The first conductor 21 may be, but does not have to be, wiring made of a conductor including a metal such as copper or a copper alloy. Optionally, the first conductor 21 may include, on its surface, a plating layer such as a nickel plating layer, a nickel-gold plating layer, or a gold plating layer.

The electronic component 3 may be a semiconductor chip, for example, and may more specifically be a flip-chip bonded chip such as a ball-grid array (BGA), a land-grid array (LGA), or a chip size package (CSP) chip. Alternatively, the electronic component 3 may also be a package on package (PoP) chip. A second conductor 31 is formed on the surface of the electronic component 3. Thus, the electronic component 3 includes the second conductor 31. The second conductor 31 may be, but does not have to be, electrode pads made of a conductor including a metal such as copper or a copper alloy, for example. Optionally, the second conductor 31 may include, on its surface, a plating layer such as a nickel plating layer, a nickel-gold plating layer, or a gold plating layer.

The bumps 32 are fixed between the first conductor 21 of the circuit board 2 and the second conductor 31 of the electronic component 3. The bumps 32 electrically connect the first conductor 21 and the second conductor 31 to each other. The bumps 32 may be made of, for example, solder. In that case, the solder may be, but does not have to be, SAC solder (lead-free solder) or tin-copper based (Sn—Bi based) solder.

Each of the reinforcing portions 4 is a cured product of the resin composition (X). In this mounting structure 1, the reinforcing portion 4 is adhered to the outside of each of the joints 20 between the bumps 32 and the first conductor 21. This allows the reinforcing portions 4 to reinforce the joints 20 between the bumps 32 and the first conductor 21 and thereby improve the connection reliability of the mounting structure 1. Note that if the connection reliability were low, then stress, caused by a variation in environmental temperature, for example, would be applied repeatedly, thus sometimes causing a fatigue failure.

In the mounting structure 1 shown in FIG. 4A, the reinforcing portions 4 are adhered to the outside (i.e., the outer surface) of the joints 20 between the first conductor 21 of the circuit board 2 and the bumps 32, but this configuration is only an example and should not be construed as limiting. Alternatively, as in the mounting structure 1 shown in FIG. 4B, for example, the reinforcing portion 4 may also be adhered to the outside of each of the joints 20 between the second conductor 31 of the electronic component 3 and the bumps 32. Still alternatively, as in the mounting structure 1 shown in FIG. 4C, for example, the reinforcing portion 4 may be adhered to not only the outside of each of the joints 20 between the first conductor 21 of the circuit board 2 and the bumps 32 but also the outside of each of the joints 20 between the second conductor 31 of the electronic component 3 and the bumps 32.

Figure 4B:
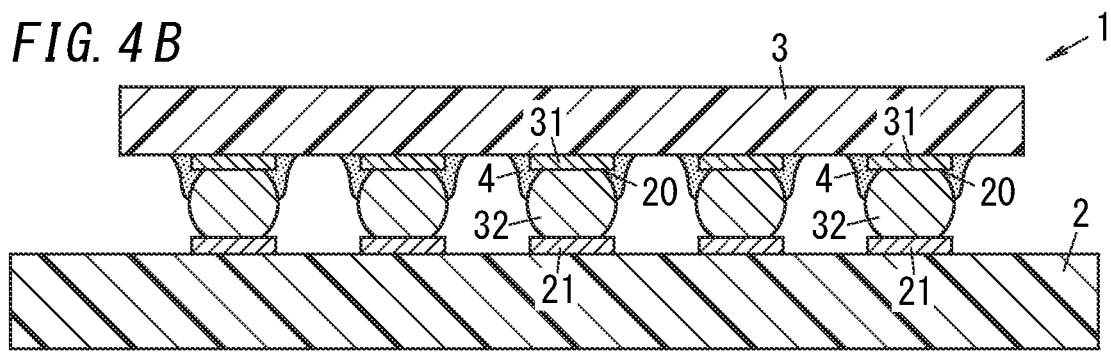
Figure 4C:
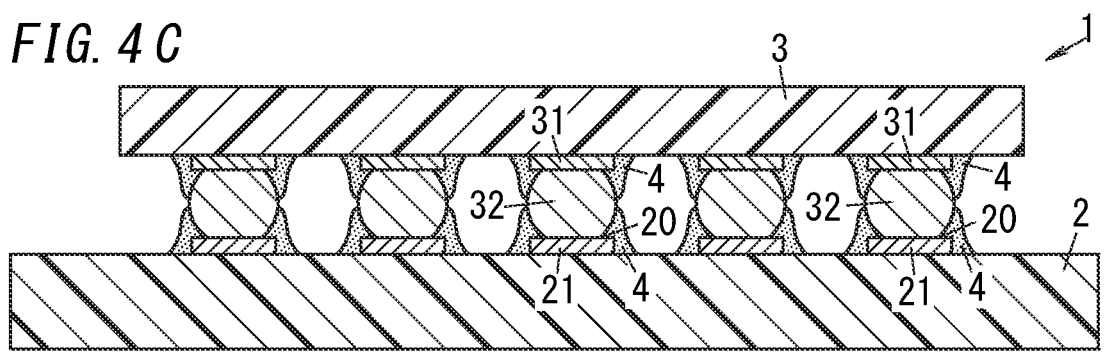

Yet alternatively, if an interval between adjacent parts of the first conductor 21 is short (narrow pitch) in the mounting structures 1 shown in the FIGS. 4A and 4C, or if an interval between adjacent parts of the second conductor 31 is short in the mounting structures 1 shown in FIGS. 4B and 4C, adjacent parts of the reinforcing portions 4 may be connected together. Optionally, in the mounting structures 1 shown in the FIGS. 4A-4C, all adjacent reinforcing portions 4 may be connected together. In other words, the surface of the circuit board 2 may be covered with the reinforcing portion 4, and the surface of the electronic component 3 may be covered with the reinforcing portion 4.

Furthermore, in the mounting structure 1 shown in FIG. 4C, each of the reinforcing portions 4 adhered to the outside of the joints 20 between the first conductor 21 and the bumps 32 and an associated one of the reinforcing portions 4 adhered to the outside of the joints 20 between the second conductor 31 and the bumps 32 may be connected together. However, if the bumps 32 are heated multiple times at a temperature equal to or higher than the melting point of the solder as a constituent material for the bumps 32 (in, for example, reflow process and repair process), an internal pressure may increase at the time of remelting of the solder, thus possibly causing a solder flash. When the solder flash is brought about, the bumps 32 could expand so much as to cause breakdown to the first conductor 21 and the second conductor 31. Therefore, the reinforcing portions 4 adhered to the outside of the joints 20 between the first conductor 21 and the bumps 32 and the reinforcing portions 4 adhered to the outside of the joints 20 between the second conductor 31 and the bumps 32 are preferably not connected together.

(2) Manufacturing Method of Mounting Structure

A manufacturing method of the mounting structure 1 shown in FIG. 4A will be described with reference to FIGS. 5A-5C.

Figure 5A:
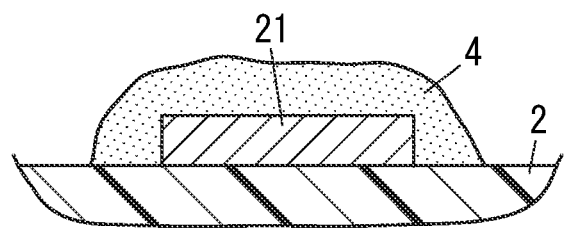
FIGS. 5A-5C are schematic cross-sectional views illustrating an exemplary manufacturing method of the mounting structure.
Figure 5B:
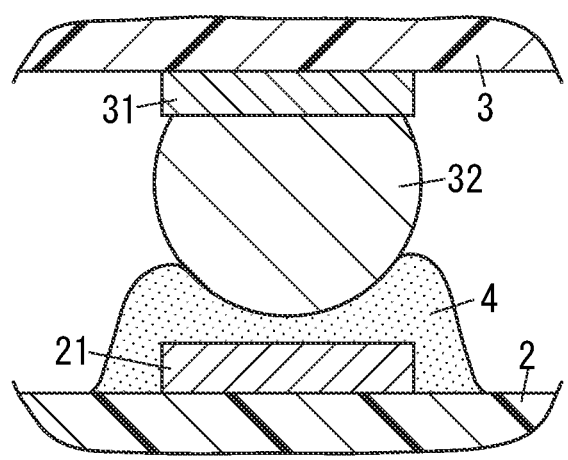
Figure 5C:
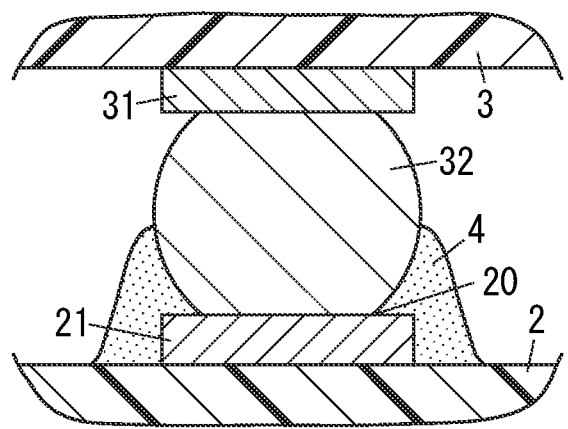

First, a circuit board 2 including a first conductor 21 is provided and the resin composition (X) is disposed to cover the first conductor 21 (see FIG. 5A). The method of disposing the resin composition (X) may be, but does not have to be, a printing method, a transfer method, or an application method, for example.

Next, an electronic component 3 including a second conductor 31 is provided. The bump 32 is provided on the second conductor 31 and the second conductor 31 and the bump 32 are electrically connected to each other. The electronic component 3 is placed on the circuit board 2 to bring the bump 32 into contact with the resin composition (X) (see FIG. 5B).

Subsequently, the bump 32 and the resin composition (X) are heated in the state shown in FIG. 5B. The heating method may be, but does not have to be, heating with a reflow furnace, for example. In that case, the bump 32 and the resin composition (X) may be heated following, for example, the reflow profile shown in FIG. 1.

As described above in the "2-2. Electronic component and its manufacturing method" section, the resin composition (X) is maintained at a low viscosity until the bump 32 melts. In addition, even if the bump 32 starts melting, the viscosity of the resin composition (X) does not immediately increase but starts to increase steeply after a while. Therefore, the resin composition (X) may be cured after the outside of the joint 20 between the first conductor 21 and the bump 32 has been covered with the resin composition (X). This allows the first conductor 21 and the bump 32 to be connected together smoothly. In addition, this may reduce the chances of causing a contact failure between the first conductor 21 and the bump 32. Furthermore, a cured product of the resin composition (X) may be adhered to the outside of the joint 20 between the first conductor 21 and the bump 32. Thus, the joint 20 between the first conductor 21 and the bump 32 may be reinforced with the reinforcing portion 4.

In the manufacturing method of the mounting structure 1 described above, the bump 32 is provided on the second conductor 31. However, this configuration is only an example and should not be construed as limiting. Alternatively, the bump 32 may be provided on the first conductor 21, for example. In that case, the resin composition (X) is arranged to cover the second conductor 31, and when the second conductor 31 and the bump 32 are connected, the resin composition (X) may be cured after the outside of the joint 20 between the second conductor 31 and the bump 32 has been covered with the resin composition (X). Then, as in the mounting structure 1 shown in FIG. 4B, the outside of the joints 20 between the second conductor 31 and the bumps 32 may be reinforced with the reinforcing portions 4.

EXAMPLES

1. Preparation of Resin Composition

Resin compositions were obtained by mixing the respective components shown in the following Tables 1-3 at the ratios shown in Tables 1-3. The details of the components shown in Tables 1-3 are as follows:

HP-6000L: mixture of naphthalene epoxy resins expressed by Formulae (5) and (6), having an epoxy group equivalent of 215, and manufactured by DIC Corporation;

HP-4032D: naphthalene epoxy resin expressed by Formula (1) having an epoxy group equivalent of 136-148 and manufactured by DIC Corporation;

HP-7250: trisphenol methane epoxy resin expressed by Formula (8) having an epoxy group equivalent of 162 and manufactured by DIC Corporation;

NC-3000-H: biphenyl aralkyl epoxy resin expressed by Formula (10), having an epoxy group equivalent of 280-300, and manufactured by Nippon Kayaku Co., Ltd.;

YX4000H: biphenyl epoxy resin expressed by Formula (11), having an epoxy group equivalent of 187-197, and manufactured by Mitsubishi Chemical Corporation;

HP-7200HHH: dicyclopentadiene epoxy resin expressed by Formula (12), having an epoxy group equivalent of 280-292, and manufactured by DIC Corporation;

YD8125: bisphenol epoxy resin in liquid state at 25° C.; manufactured by NIPPON STEEL Chemical & Material Co., Ltd.;

YDF8170: bisphenol epoxy resin in liquid state at 25° C.; manufactured by NIPPON STEEL Chemical & Material Co., Ltd.;

2PHZ-PW: 2-phenyl-4,5-dihydroxymethyl imidazole having a melting point of 230° C. and manufactured by Shikoku Chemicals Corporation;

2P4MHZ-PW: 2-phenyl-4-methyl-5-hydroxymethyl imidazole having a melting point of 191-195° C. and manufactured by Shikoku Chemicals Corporation;

2PZ-PW: 2-phenyl imidazole having a melting point of 137-147° C. and manufactured by Shikoku Chemicals Corporation;

2MAOK-PW: an isocyanurate adduct of 2,4-diamino-6-[2'-methylimidazolyl-(1')]-ethyl-s-triazine having a melting point of 260° C. and manufactured by Shikoku Chemicals Corporation;

1,2-DMZ: having a melting point of 36° C. and manufactured by Shikoku Chemicals Corporation;

Adipic acid: adipic acid manufactured by Tokyo Chemical Industry Co., Ltd.;

Succinic acid: succinic acid manufactured by Tokyo Chemical Industry Co., Ltd.;

TEA: triethanolamine manufactured by Tokyo Chemical Industry Co., Ltd.;

1,3-diphenylguanidine: 1,3-diphenylguanidine manufactured by Tokyo Chemical Industry Co., Ltd.;

Tsunodime 395: containing 94% of dimer acid and manufactured by Tsuno Co., Ltd.;

Gelol D: 1,3:2,4-bis-O-benzylidene-D-glucitol (dibenzylidene sorbitol) manufactured by New Japan Chemical Co., Ltd.;

Gelol MD: 1,3:2,4-bis-O-(4-methylbenzylidene)-D-sorbitol manufactured by New Japan Chemical Co., Ltd.;

Bisamide LA: N,N'-methylene bis (stearamide) manufactured by Mitsubishi Chemical Corporation;

DEDG: diethylene glycol diethyl ether manufactured by Nippon Nyukazai Co., Ltd.; and HEDG: diethylene glycol monohexyl ether manufactured by Nippon Nyukazai Co., Ltd.

2. Evaluations (1) Viscosity

The viscosities (Pa·s) of the resin compositions according to Examples 1-18 and Comparative Examples 1-10 were measured at 25° C. and 10 rpm. A type E viscometer (product number RE-215U manufactured by Toki Sangyo Co., Ltd.) was used to measure the viscosities. The results are summarized in the following Tables 1 and 2.

(2) Thixo Ratio

The thixo ratios of the resin compositions according to Examples 1-18 and Comparative Examples 1-10 were measured at 25° C. The thixo ratio was calculated as the ratio of the viscosity at 2.5 rpm to the viscosity at 10 rpm.

(3) Printability

The degree of printability was determined as follows by printing, with a printer, the resin compositions according to Examples 1-18 and Comparative Examples 1-10 on a substrate having an Ni—Au pad (conductor) with Φ of 250 μm and 0.5 mmP and observing their printed condition through a microscope:

Grade A: if the resin composition caused no shape problem at all;

Grade B: if the resin composition caused no problem in practice although some bridges and chips were present; or Grade C: if the resin composition had a lot of bridges and chips.

(4) Glass Transition Temperature (Tg)

The glass transition temperatures of the cured products of the resin compositions according to Examples 1-18 and Comparative Examples 1-10 were measured by thermal mechanical analysis (TMA) (in compliance with the JIS K 7197: 1991):

Grade A: if the glass transition temperature was equal to or higher than 85° C.;
Grade B: if the glass transition temperature was equal to or higher than 80° C. and lower than 85° C.; or
Grade C: if the glass transition temperature was lower than 80° C.

(5) Wet Spreadability

The wet spreadabilities are calculated on a copper plate by {(D−H)/D}×100(%), where D is the diameter of a solder ball yet to be subjected to the reflow process and H is the height of the solder ball subjected the reflow process. Note that the wet spreadabilities were calculated by a method compliant with the JIS Z 3198-3 standard and the reflow process was carried out in accordance with the reflow profile shown in FIG. 1:

Grade A: if the wet spreadability was equal to or greater than 60%;
Grade B: if the wet spreadability was equal to or greater than 50% but less than 60%; or
Grade C: if the wet spreadability was less than 50%.

(6) Life

The life is defined by the time from the beginning through the end of storage. That is to say, the life was calculated by (viscosity after storage/viscosity at the beginning of storage)×100(%) and determined to be the time that it took for the life to reach 120% (at a storage temperature of 25° C.; the viscosity was measured as in (1)):

Grade A: if the life was equal to or longer than 24 hours;
Grade B: if the life was equal to or longer than 20 hours but shorter than 24 hours; or
Grade C: if the life was shorter than 20 hours.

(7) Total Evaluation

The total evaluation of the resin composition according to each of the respective examples and comparative examples was made as follows in terms of their printability, wet spreadability, and life:

Grade A: if the resin composition was graded A in all of the printability, wet spreadability, and life;
Grade B: if the resin composition was graded B in at least one of the printability, wet spreadability, or life and not graded C in any of these parameters; or
Grade C: if the resin composition was graded C in at least one of the printability, wet spreadability, or life.

These results of evaluation are summarized in the following Tables 1-3:

TABLE 1

| | Type | Model No. | Ex.1 | Ex.2 | Ex.3 | Ex.4 | Ex.5 | Ex.6 | Ex.7 | Ex.8 | Ex.9 |
|---|---|---|---|---|---|---|---|---|---|---|---|
| Components and contents (% by weight) | Naphthalene epoxy resin | HP-6000L | 20 | 65 | 67.5 | | | | | | |
| | | HP-4032D | | | | 35 | 35 | 35 | 35 | | |
| | Trisphenol methane epoxy resin | HP-7250 | | | | 26 | 26 | 21 | 21 | 30.8 | 30.8 |
| | Biphenyl aralkyl epoxy resin | NC-3000-H | | | | | | | | | |
| | Biphenyl epoxy resin | YX4000H | | | | | | | | | |
| | Dicyclopentadiene epoxy resin | HP-7200HHH | | | | | | | | | |
| | Bisphenol epoxy resin | YD8125 | 70.2 | | | 24.5 | 24.25 | 25.25 | 25 | 39.5 | 39.4 |
| | | YDF8170 | | 21.2 | 18.7 | | | | | 15.55 | 15.5 |
| | Imidazole compound | 2PHZ-PW | 0.5 | 0.5 | 0.5 | | | | | 0.05 | 0.2 |
| | | 2P4MHZ-PW | | | | 0.75 | 0.75 | 0.75 | 0.75 | | |
| | | 2PZ-PW | | | | | | | | | |
| | | 2MAOK-PW | | | | | | | | | |
| | | 1,2-DMZ | | | | | | | | | |
| | Activator | Adipic acid | 0.8 | 0.8 | 0.8 | | | | | 2.5 | 2.5 |
| | | Succinic acid | | | | 3 | 3 | 3 | 3 | | |
| | | TEA | | | | 3 | 3 | 3 | 3 | | |
| | | 1,3-diphenyl guanidine | 3 | 3 | 3 | 3 | 3 | 3 | 3 | 3.3 | 3.3 |
| | | Tsunodime 395 | 3 | 3 | 3 | | | | | 3.3 | 3.3 |
| | Thixo agent | Gelol D | 2.5 | 2.5 | 2.5 | | | | | 3 | 3 |
| | | Gelol MD | | | | 0.75 | 1 | 5 | 5.25 | | |
| | | Bisamide LA | | | | | | | | | |
| | Solvent | DEDG | | 4 | 4 | 4 | 4 | 4 | 4 | 2 | 2 |
| | | HeDG | | | | | | | | | |
| Evaluation | Viscosity (Pa·s) | Type E viscometer, 25° C., 10 rpm | 75 | 235 | 248 | 165 | 180 | 258 | 275 | 126 | 124 |
| | Thixo ratio (2.5 rpm/10 rpm) | Type E viscometer, 25° C. | 3.8 | 3.5 | 3.2 | 1.7 | 2.2 | 4.9 | 5.4 | 3.9 | 4 |
| | Printability | Ni-Au pad substrate | A | A | B | B | A | A | B | A | A |
| | Tg (° C.) | TMA | A | A | A | A | A | A | A | A | A |
| | Wet spreadability | on copper plate | A | A | B | B | A | A | B | A | A |
| | Life | Viscosity increase rate | A | A | A | A | A | A | A | A | A |
| | Total evaluation | | A | A | B | B | A | A | B | A | A |

TABLE 2

| | Type | Model No. | Ex10 | Ex11 | Ex12 | Ex13 | Ex14 | Ex15 | Ex16 | Ex17 | Ex18 |
|---|---|---|---|---|---|---|---|---|---|---|---|
| Components and contents (% by weight) | Naphthalene epoxy resin | HP-6000L | | | | | | | | | |
| | | HP-4032D | | | | | | | | | |
| | Trisphenol methane epoxy resin | HP-7250 | 30.8 | 30.8 | 30.8 | 30.8 | 30.8 | 30.8 | | | |
| | Biphenyl aralkyl epoxy resin | NC-3000-H | | | | | | | 40 | | |
| | Biphenyl epoxy resin | YX4000H | | | | | | | | 30 | |
| | Dicyclopentadiene epoxy resin | HP-7200HHH | | | | | | | | | 25 |
| | Bisphenol epoxy resin | YD8125 | 39.4 | 39.4 | 37.4 | 37.4 | 18 | 19.7 | 21 | 15 | 30 |
| | | YDF8170 | 13.7 | 13.45 | 22 | 21.5 | 25.9 | 21.7 | 25.5 | 36.5 | 33.2 |
| | Imidazole compound | 2PHZ-PW | 2 | 2.25 | 0.3 | 0.3 | 0.3 | 0.3 | | | |
| | | 2P4MHZ-PW | | | | | | | | | |
| | | 2PZ-PW | | | | | | | 0.5 | | |
| | | 2MAOK-PW | | | | | | | | 0.5 | 0.5 |
| | | 1,2-DMZ | | | | | | | | | |
| | Activator | Adipic acid | 2.5 | 2.5 | 1.2 | 1.4 | 5.6 | 6.3 | 5 | | 3 |
| | | Succinic acid | | | | | | | 5 | | |
| | | TEA | | | | | | | | 5.5 | |
| | | 1,3-diphenyl guanidine | 3.3 | 3.3 | 1.65 | 1.8 | 7.2 | 8.1 | | 5.5 | 3 |
| | | Tsunodime 395 | 3.3 | 3.3 | 1.65 | 1.8 | 7.2 | 8.1 | | | 0.8 |
| | Thixo agent | Gelol D | 3 | 3 | 3 | 3 | 3 | 3 | | | 2.5 |
| | | Gelol MD | | | | | | | | | |
| | | Bisamide LA | | | | | | | 3 | 3 | |
| | Solvent | DEDG | 2 | 2 | 2 | 2 | 2 | 2 | | 4 | |
| | | HeDG | | | | | | | | | 2 |
| Evaluation | Viscosity (Pa·s) | Type E viscometer, 25° C., 10 rpm | 131 | 133 | 120 | 122 | 135 | 139 | 90 | 78 | 65 |
| | Thixo ratio (2.5 rpm/10 rpm) | Type E viscometer, 25° C. | 4 | 4.1 | 3.6 | 3.8 | 4.2 | 4.3 | 4.5 | 3.9 | 4.1 |
| | Printability | Ni-Au pad substrate | A | A | A | A | A | A | A | A | A |
| | Tg (° C.) | TMA | A | A | A | A | A | A | A | A | A |
| | Wet spreadability | on copper plate | A | B | B | A | A | A | A | A | A |
| | Life | Viscosity increase rate | A | A | A | A | A | A | A | A | A |
| | Total evaluation | | A | B | B | A | A | A | A | A | A |

TABLE 3

| | Type | Model No. | Cm1 | Cm2 | Cm3 | Cm4 | Cm5 | Cm6 | Cm7 | Cm8 | Cm9 | Cm10 |
|---|---|---|---|---|---|---|---|---|---|---|---|---|
| Components and contents (% by weight) | Naphthalene epoxy resin | HP-6000L | | 15 | 70 | | | | | | | |
| | | HP-4032D | | | | 35 | 35 | | | | | |
| | Trisphenol methane epoxy resin | HP-7250 | | | | 26 | 21 | 30.8 | 30.8 | 30.8 | 30.8 | 30.8 |
| | Biphenyl aralkyl epoxy resin | NC-3000-H | | | | | | | | | | |
| | Biphenyl epoxy resin | YX4000H | | | | | | | | | | |
| | Dicyclopentadiene epoxy resin | HP-7200HHH | | | | | | | | | | |
| | Bisphenol epoxy resin | YD8125 | 46.7 | 74.7 | | 24.75 | 24.75 | 39.5 | 39.5 | 39.5 | 31.5 | 20.5 |
| | | YDF8170 | 43 | | 15.7 | | | 14.6 | 15.575 | 13.1 | 28.4 | 18.4 |
| | Imidazole compound | 2PHZ-PW | 1 | 1 | 1 | | | | 0.025 | 2.5 | 0.3 | 0.3 |
| | | 2P4MHZ-PW | | | | 0.75 | 0.75 | | | | | |
| | | 2PZ-PW | | | | | | | | | | |
| | | 2MAOK-PW | | | | | | | | | | |
| | | 1,2-DMZ | | | | | | 1 | | | | |
| | Activator | Adipic acid | 0.8 | 0.8 | 0.8 | | | | 2.5 | 2.5 | 2.5 | 1.2 | 7 |
| | | Succinic acid | | | | 3 | 3 | | | | | |
| | | TEA | | | | 3 | 3 | | | | | |
| | | 1,3-diphenyl guanidine | 3 | 3 | 3 | 3 | 3 | | 3.3 | 3.3 | 3.3 | 1.4 | 9 |
| | | Tsunodime 395 | 3 | 3 | 3 | | | | 3.3 | 3.3 | 3.3 | 1.4 | 9 |

TABLE 3-continued

| | Type | Model No. | Cm1 | Cm2 | Cm3 | Cm4 | Cm5 | Cm6 | Cm7 | Cm8 | Cm9 | Cm10 |
|---|---|---|---|---|---|---|---|---|---|---|---|---|
| | Thixo agent | Gelol D | 2.5 | 2.5 | 2.5 | | | 3 | 3 | 3 | 3 | 3 |
| | | Gelol MD | | | | 0.5 | 5.5 | | | | | |
| | | Bisamide LA | | | | | | | | | | |
| | Solvent | DEDG | | | 4 | 4 | 4 | 2 | 2 | 2 | 2 | 2 |
| | | HeDG | | | | | | | | | | |
| Evaluation | Viscosity (Pa · s) | Type E viscometer, 25° C.,10 rpm | 43 | 59 | 264 | 143 | 291 | 128 | 125 | 134 | 121 | 150 |
| | Thixo ratio (2.5 rpm/10 rpm) | Type E viscometer, 25° C. | 4.1 | 3.9 | 3.1 | 1.3 | 5.8 | 3.8 | 3.8 | 4 | 3.2 | 4.1 |
| | Printability | Ni-Au pad substrate | A | A | C | C | C | A | A | A | A | A |
| | Tg (° C.) | TMA | C | C | A | A | A | A | C | A | A | B |
| | Wet spreadability | on copper plate | A | A | C | C | C | C | A | C | C | B |
| | Life | Viscosity increase rate | A | A | A | A | A | B | A | B | A | C |
| | Total evaluation | | C | C | C | C | C | C | C | C | C | C |

In Examples 1-3, the glass transition temperature was higher than in Comparative Examples 1 and 2. Thus, it can be seen that the resin composition (X) preferably includes 17.5% by weight to 70% by weight of epoxy resin (A1).

In Examples 4-7, the printability and wet spreadability were better than in Comparative Example 4. Thus, it would be preferable that the resin composition (X) include 0.75% by weight to 5.55% by weight of thixo agent (C). Nevertheless, comparing Example 4 with Examples 5, 6, and 7, even better results were obtained in Examples 5, 6, and 7 than in Example 4. Thus, it would be particularly preferable that the resin composition (X) include 0.9% by weight to 5.3% by weight of thixo agent (C).

In Examples 8-11, the wet spreadability and life were better than in Comparative Example 6. Thus, it can be seen that the imidazole compound (B) preferably has a melting point equal to or higher than 130° C. In addition, comparing Examples 8-11 with Comparative Examples 7 and 8, it can be seen that the content of the imidazole compound (B) is preferably equal to or greater than 0.05% by weight and equal to or less than 2.4% by weight. Furthermore, comparing Example 8 with Examples 9, 10, and 11, it can be seen that the content of the imidazole compound (B) is particularly preferably equal to or greater than 0.01% by weight and equal to or less than 2.35% by weight.

Comparing Examples 12-15 with Comparative Example 9, Comparative Example 9 had a smaller content of activator (D) and resulted in a lower wet spreadability. On the other hand, Comparative Example 10 has too large an activator (D) content and its printability, glass transition temperature, wet spreadability, and life were all inferior to Examples 12-15. Thus, it would be preferable that the content of the activator (D) be equal to or greater than 4.25% by weight to 23% by weight. In addition, comparing Examples 12 and 15 with Examples 13 and 14, better results were obtained in Examples 13 and 14 and it would be particularly preferable that the content of the activator (D) be equal to or greater than 4.75% by weight and equal to or less than 22% by weight.

In Examples 16-18, good results were achieved. Thus, it can be seen that an epoxy resin having a biphenyl aralkyl skeleton, a biphenyl skeleton, or a dicyclopentadiene skeleton may also be used as the epoxy resin (A1).

REFERENCE SIGNS LIST

1 Mounting Structure
2 Circuit Board
3 Electronic Component
20 Joint
21 First Conductor
30, 32 Bump
31 Second Conductor
100 Electronic Component
200 Electronic Component Body
210 Conductor

The invention claimed is:

1. A flux resin composition comprising an epoxy resin (A), an imidazole compound (B), a thixo agent (C), and an activator (D),
   the epoxy resin (A) including at least one resin selected from the group consisting of naphthalene epoxy resins, biphenyl aralkyl epoxy resins, trisphenol methane epoxy resins, biphenyl epoxy resins, and dicyclopentadiene epoxy resins, content of the at least one resin being equal to or greater than 20% by weight with respect to a total weight of the epoxy resin (A), wherein
   with respect to a total of the epoxy resin (A), the imidazole compound (B), the thixo agent (C), and the activator (D):
      a proportion of the epoxy resin (A) is equal to or greater than 70% by weight and equal to or less than 94.7% by weight,
      a proportion of the imidazole compound (B) is equal to or greater than 0.05% by weight and equal to or less than 2.4% by weight,
      a proportion of the thixo agent (C) is equal to or greater than 0.75% by weight and equal to or less than 5.55% by weight, and
      a proportion of the activator (D) is equal to or greater than 4.25% by weight and equal to or less than 23% by weight,
   a time it takes for a value calculated by (viscosity of the flux resin composition after storage/ viscosity of the flux resin composition at beginning of the storage)×100(%)

to reach 120% since the flux resin composition has started to be stored at 25° C. being equal to or longer than 24 hours, the flux resin composition allowing a solder ball to have a wet spreadability equal to or greater than 50% before and after a reflow process, and a cured product of the flux resin composition having a glass transition temperature equal to or higher than 85° C.

2. The flux resin composition of claim 1, wherein the imidazole compound (B) has a melting point equal to or higher than 130° C.

3. The flux resin composition of claim 1, wherein the flux resin composition has, at 25° C. and 10 rpm, a viscosity equal to or greater than 35 Pa·s and equal to or less than 280 Pa·s and has a thixo ratio equal to or greater than 1.5 and equal to or less than 5.5, wherein the thixo ratio of the flux resin composition indicates a ratio of a viscosity of the flux resin composition measured using a rotational viscometer with a number of revolutions of the viscometer at 2.5 rpm divided by a viscosity of the flux resin composition measured using a rotational viscometer with a number of revolutions of the viscometer at 10 rpm, each viscosity measured at a constant temperature of 25° C.

4. An electronic component comprising:
an electronic component body;
a conductor formed on a surface of the electronic component body;
a bump of solder disposed on the conductor and electrically connected to the conductor; and
a reinforcing portion that is a cured product of the flux resin composition of claim 1 and reinforces a joint between the conductor and the bump.

5. A method for manufacturing the electronic component of claim 4, the method comprising
curing the flux resin composition after adhering the flux resin composition onto the joint between the conductor and the bump.

6. A mounting structure comprising:
a circuit board including a first conductor;
an electronic component including a second conductor;
a bump of solder interposed between the first conductor and the second conductor and electrically connecting the first conductor and the second conductor to each other; and
a reinforcing portion that is a cured product of the flux resin composition of claim 1 and reinforces at least one of a joint between the first conductor and the bump or a joint between the second conductor and the bump.

7. A method for manufacturing the mounting structure of claim 6, the method comprising
curing the flux resin composition after adhering the flux resin composition onto at least one of the joint between the first conductor and the bump or the joint between the second conductor and the bump.

8. The flux resin composition of claim 2, wherein the flux resin composition has, at 25° C. and 10 rpm, a viscosity equal to or greater than 35 Pa·s and equal to or less than 280 Pa·s and has a thixo ratio equal to or greater than 1.5 and equal to or less than 5.5, wherein the thixo ratio of the flux resin composition indicates a ratio of a viscosity of the flux resin composition measured using a rotational viscometer with a number of revolutions of the viscometer at 2.5 rpm divided by a viscosity of the flux resin composition measured using a rotational viscometer with a number of revolutions of the viscometer at 10 rpm, each viscosity measured at a constant temperature of 25° C.

9. An electronic component comprising:
an electronic component body;
a conductor formed on a surface of the electronic component body;
a bump of solder disposed on the conductor and electrically connected to the conductor; and
a reinforcing portion that is a cured product of the flux resin composition of claim 2 and reinforces a joint between the conductor and the bump.

10. A method for manufacturing the electronic component of claim 9, the method comprising
curing the flux resin composition after adhering the flux resin composition onto the joint between the conductor and the bump.

11. A mounting structure comprising:
a circuit board including a first conductor;
an electronic component including a second conductor;
a bump of solder interposed between the first conductor and the second conductor and electrically connecting the first conductor and the second conductor to each other; and
a reinforcing portion that is a cured product of the flux resin composition of claim 2 and reinforces at least one of a joint between the first conductor and the bump or a joint between the second conductor and the bump.

12. A method for manufacturing the mounting structure of claim 11, the method comprising
curing the flux resin composition after adhering the flux resin composition onto at least one of the joint between the first conductor and the bump or the joint between the second conductor and the bump.

13. An electronic component comprising:
an electronic component body;
a conductor formed on a surface of the electronic component body;
a bump of solder disposed on the conductor and electrically connected to the conductor; and
a reinforcing portion that is a cured product of the flux resin composition of claim 3 and reinforces a joint between the conductor and the bump.

14. A method for manufacturing the electronic component of claim 13, the method comprising
curing the flux resin composition after adhering the flux resin composition onto the joint between the conductor and the bump.

15. A mounting structure comprising:
a circuit board including a first conductor;
an electronic component including a second conductor;
a bump of solder interposed between the first conductor and the second conductor and electrically connecting the first conductor and the second conductor to each other; and
a reinforcing portion that is a cured product of the flux resin composition of claim 3 and reinforces at least one of a joint between the first conductor and the bump or a joint between the second conductor and the bump.

16. A method for manufacturing the mounting structure of claim 15, the method comprising
curing the flux resin composition after adhering the flux resin composition onto at least one of the joint between the first conductor and the bump or the joint between the second conductor and the bump.

* * * * *